United States Patent
Kang et al.

(10) Patent No.: US 9,921,267 B2
(45) Date of Patent: Mar. 20, 2018

(54) APPARATUS AND METHOD FOR TESTING SEMICONDUCTOR

(71) Applicant: Samsung Electronics Co., Ltd., Suwon-si, Gyeonggi-do (KR)

(72) Inventors: Sangboo Kang, Suwon-si (KR); MinJung Kim, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 147 days.

(21) Appl. No.: 14/854,209

(22) Filed: Sep. 15, 2015

(65) Prior Publication Data

US 2016/0131700 A1 May 12, 2016

(30) Foreign Application Priority Data

Nov. 11, 2014 (KR) .......................... 10-2014-0156177

(51) Int. Cl.
*G01R 31/20* (2006.01)
*G01R 31/28* (2006.01)

(52) U.S. Cl.
CPC ..... *G01R 31/2891* (2013.01); *G01R 31/2831* (2013.01)

(58) Field of Classification Search
USPC ............. 324/750.01, 754.11, 762.01–762.03, 324/754.01–754.09, 754.12–754.16
See application file for complete search history.

(56) References Cited

U.S. PATENT DOCUMENTS

| | | | | |
|---|---|---|---|---|
| RE30,601 E | * | 5/1981 | Horr | G03F 7/70691 269/21 |
| 4,934,064 A | * | 6/1990 | Yamaguchi | G01R 1/07314 324/750.19 |
| 5,642,056 A | * | 6/1997 | Nakajima | G01R 1/06705 324/750.22 |
| 6,605,954 B1 | * | 8/2003 | Nagar | G01R 1/07307 324/756.03 |
| 6,647,632 B2 | * | 11/2003 | Tominaga | G03F 7/70775 33/1 M |
| 6,777,968 B1 | | 8/2004 | Kobayashi et al. | |
| 6,927,587 B2 | | 8/2005 | Yoshioka | |
| 7,135,883 B2 | | 11/2006 | Komatsu | |
| 7,405,584 B2 | | 7/2008 | Fujita et al. | |
| 7,504,844 B2 | | 3/2009 | Yamada | |
| 7,777,511 B2 | | 8/2010 | Hagihara | |
| 7,855,568 B2 | | 12/2010 | Yamada | |
| 8,130,004 B2 | | 3/2012 | Yamada et al. | |

(Continued)

FOREIGN PATENT DOCUMENTS

| | | |
|---|---|---|
| JP | 2006173206 | 6/2006 |
| JP | 2006186130 | 7/2006 |

(Continued)

*Primary Examiner* — Patrick Assouad
*Assistant Examiner* — Demetruis Pretlow
(74) *Attorney, Agent, or Firm* — Onello & Mello, LLP.

(57) ABSTRACT

Provided is an apparatus for testing a semiconductor. The apparatus includes a chuck on which a wafer is disposed, a probe card disposed on the chuck to provide a test signal to the wafer, a sensor disposed in the probe card, a base unit connected to the probe card to transmit the test signal to the probe card, and a pressure device connecting the base unit to the probe card, the pressure device correcting deformation of the probe card.

20 Claims, 13 Drawing Sheets

(56) References Cited

U.S. PATENT DOCUMENTS

| | | | | |
|---|---|---|---|---|
| 8,436,633 B2* | 5/2013 | Sano | ................ | G01R 31/2891 |
| | | | | 324/762.01 |
| 8,810,270 B2 | 8/2014 | Yang | | |
| 2002/0031849 A1* | 3/2002 | Maruyama | ......... | G01R 31/2891 |
| | | | | 438/14 |
| 2007/0159194 A1* | 7/2007 | Hasegawa | ......... | G01R 31/2889 |
| | | | | 324/750.19 |
| 2009/0284273 A1* | 11/2009 | Hasegawa | ......... | H01R 13/2407 |
| | | | | 324/756.07 |
| 2011/0156735 A1* | 6/2011 | Breinlinger | ......... | G01R 1/0491 |
| | | | | 324/750.19 |

FOREIGN PATENT DOCUMENTS

| | | |
|---|---|---|
| JP | 2006317294 | 11/2006 |
| JP | 2010190795 | 9/2010 |
| JP | 2011108695 | 6/2011 |
| KR | 2008024002 | 3/2008 |

* cited by examiner

APPARATUS AND METHOD FOR TESTING SEMICONDUCTOR

CROSS-REFERENCE TO RELATED APPLICATIONS

This U.S. non-provisional patent application claims priority under 35 U.S.C. § 119 of Korean Patent Application No. 10-2014-0156177, filed on Nov. 11, 2014, the entire contents of which are hereby incorporated by reference.

BACKGROUND

Exemplary embodiments in accordance with principles of inventive concepts relate to a semiconductor device, and more particularly, to an apparatus and method for testing a semiconductor device.

In general, semiconductor devices are manufactured using a fabrication (FAB) process in which patterns are formed on a wafer, and an assembly process in which the wafer on which patterns are formed is sliced into unit chips, and then each unit chip is assembled. Also, an electric die sorting (EDS) process by which electrical characteristics of a unit semiconductor device constituting the wafer are tested is performed between the FAB process and the assembly process.

The EDS process may be performed so as to distinguish defective devices of the semiconductor devices constituting the wafer. In the EDS process, a test apparatus may be employed to apply an electrical signal to the semiconductor devices constituting the wafer to determine whether a semiconductor device is defective.

A probe card is provided to the test apparatus. Tips that are in contact with electrode pads of the semiconductor devices to apply the electrical signal may be disposed on the probe card to test the electrical characteristics of the semiconductor devices constituting the wafer.

SUMMARY

Exemplary embodiments in accordance with principles of inventive concepts provide an apparatus for testing a semiconductor that is capable of correcting warpage of a probe card.

Exemplary embodiments in accordance with principles of inventive concepts provide an apparatus for testing a semiconductor that is capable of correcting vertical movement of a probe card.

Exemplary embodiments in accordance with principles of inventive concepts provide an apparatus for testing a semiconductor that is capable of measuring an overdriving amount through a sensor, a photographing member, and resistance to correct warpage of a probe card.

Exemplary embodiments in accordance with principles of inventive concepts include a chuck to carry a semiconductor wafer; a probe card disposed on the chuck to provide a test signal to the wafer; a sensor to measure a relative distance disposed in the probe card; a base unit connected to the probe card to transmit the test signal to the probe card; and a pressure device connecting the base unit to the probe card, the pressure device correcting deformation of the probe card.

Exemplary embodiments in accordance with principles of inventive concepts include a pressure device are provided in plurality on a central portion of the probe card and along a circumference of the probe card.

Exemplary embodiments in accordance with principles of inventive concepts include a probe card that includes a probe substrate; a stiffener disposed on the probe substrate; a lower substrate disposed under the probe substrate; and tips connected to the lower substrate.

Exemplary embodiments in accordance with principles of inventive concepts include a sensor that includes a first sensor disposed in the probe substrate; and a second sensor disposed in the lower substrate, wherein the first sensor is provided in plurality in a central portion of the probe substrate and along an outer circumferential surface of the probe substrate, and the second sensor is provided in plurality along an outer circumferential surface of the lower substrate.

Exemplary embodiments in accordance with principles of inventive concepts include the first sensor is configured to measure a distance between the probe substrate and the lower substrate, and the second sensor is configured to measure a distance between the lower substrate and the chuck.

Exemplary embodiments in accordance with principles of inventive concepts include a control unit for controlling the first sensor, the second sensor, and the pressure device, wherein the first sensor is configured to measure a first distance that is a distance between the probe substrate and the lower substrate at a moment in which the tips contact the wafer and a second distance that is a distance between the probe substrate and the lower substrate at a moment in which the test is completed, the second sensor is configured to measure a third distance that is a distance between the lower substrate and the chuck at a moment in which the tips contact the wafer and a fourth distance that is a distance between the lower substrate and the chuck at a moment in which the test is completed, and the control unit is configured to calculate a correction force based on a difference between the first distance and the second distance and a difference between the third distance and the fourth distance.

Exemplary embodiments in accordance with principles of inventive concepts include a probe chamber surrounding the chuck, wherein a movable photographing member is provided on an inner wall of the probe chamber to photograph the wafer on the chuck.

Exemplary embodiments in accordance with principles of inventive concepts include a control unit for controlling the photographing member and the pressure device, wherein the photographing member is configured to photograph a first image that is an image of the wafer after the tips first contact the wafer and a second image that is an image of the wafer after the tips next contact the wafer, and the control unit compares the first image to the second image to calculate a correction force.

Exemplary embodiments in accordance with principles of inventive concepts include a tester connected to the base unit, wherein the tester comprises: a tester head disposed on the base unit; and a tester body electrically connected to the tester head, wherein the tester body, the tester head, the base unit, and the probe card are electrically connected to each other.

Exemplary embodiments in accordance with principles of inventive concepts include a control unit connected to the tester to control the pressure device, wherein the tester is configured to apply current to a semiconductor device on the wafer at a moment in which the tips contact the wafer to measure a first resistance of the semiconductor device, the tester applies current to the semiconductor device on the wafer after the test is completed to measure a second resistance of the semiconductor device, and the control unit receives the first resistance and second resistance measured by the tester to calculate a correction force.

Exemplary embodiments in accordance with principles of inventive concepts include a method of testing a semiconductor device including providing a semiconductor wafer including the device on a chuck; allowing tips disposed on a bottom surface of a probe card to contact the wafer; determining a correction force according to deformation of the probe card; and applying a pressure to the probe card using a plurality of pressure devices disposed on a central portion of the probe card and along an outer circumferential surface of the probe card according to the correction force to correct warpage of the probe card.

Exemplary embodiments in accordance with principles of inventive concepts include the probe card includes a probe substrate; a stiffener disposed on the probe substrate; a lower substrate disposed under the probe substrate; and tips connected to the lower substrate, wherein a sensor is provided in the probe card, wherein the sensor comprises: a first sensor disposed on the probe substrate; and a second sensor disposed on the lower substrate, wherein the first sensor is provided in plurality on a central portion of the probe substrate and along an outer circumferential surface of the probe substrate, and the second sensor is provided in plurality along an outer circumferential surface of the lower substrate.

Exemplary embodiments in accordance with principles of inventive concepts include a method wherein the determination of a correction force comprises: measuring a first distance that is a distance between the probe substrate and the lower substrate at a moment in which the tips contact the wafer and a second distance that is a distance between the probe substrate and the lower substrate at a moment in which the test is completed, by the first sensor; measuring a third distance that is a distance between the lower substrate and the chuck at a moment in which the tips contact the wafer and a fourth distance that is a distance between the lower substrate and the chuck at a moment in which the test is completed, by the second sensor; and determining a correction force based on a difference between the first distance and the second distance and a difference between the third distance and the fourth distance.

Exemplary embodiments in accordance with principles of inventive concepts include a method wherein the determination of a correction force comprises: allowing the tips to firstly contact the wafer to photograph a first contact mark with respect to the wafer; allowing the tips to secondly-contact the wafer after a test is completed to photograph a second contact mark with respect to the wafer; and comparing the first contact mark to the second contact mark to determine a correction force based on a difference between clear degrees of the contact marks formed on the wafer.

Exemplary embodiments in accordance with principles of inventive concepts include a method wherein the determination of a correction force comprises: allowing the tips to contact the wafer to apply current, thereby measuring a first resistance of a semiconductor device on the wafer; allowing the tips to contact the wafer after a test is completed to apply the current, thereby measuring a second resistance of the semiconductor device on the wafer; and determining a correction force based on a difference between the first resistance and the second resistance.

Exemplary embodiments in accordance with principles of inventive concepts include a method of testing a semiconductor device, the method comprising: a probe card applying a test signal to a semiconductor wafer including the semiconductor device; a sensor determining distortion of the probe card during the test process; and providing a correction force to the probe card to counteract the distortion of the probe card.

Exemplary embodiments in accordance with principles of inventive concepts include a method wherein the correction force varies across the probe card.

Exemplary embodiments in accordance with principles of inventive concepts include a method that includes testing the semiconductor wafer at various temperatures.

Exemplary embodiments in accordance with principles of inventive concepts include a method wherein the distortion of the probe card is determined by measuring distances of the probe card from reference points before and after conducting a wafer test.

Exemplary embodiments in accordance with principles of inventive concepts include a method wherein the correction force is applied to the probe card during a wafer test subsequent to a wafer test during which distortion of the probe card is measured.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
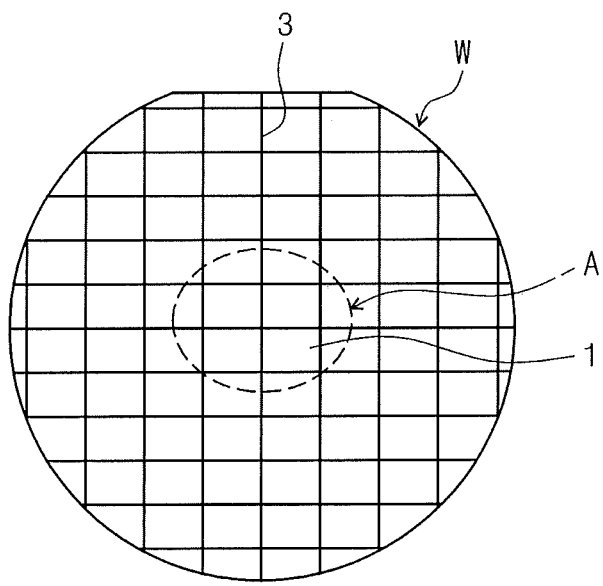
FIG. 1 is a view of a wafer on which semiconductor devices are disposed.

Advantages and features of inventive concepts, and implementation methods thereof will be clarified through following embodiments described with reference to the accompanying drawings. Inventive concepts may, however, be embodied in different forms and should not be construed as limited to the embodiments set forth herein. Rather, these embodiments are provided so that this disclosure will be thorough, and will fully convey the scope of inventive concepts to those skilled in the art. Further, inventive concepts are only defined by scopes of claims. Like reference numerals refer to like elements throughout.

Embodiments in the detailed description will be described with sectional views as ideal exemplary views of inventive concepts. In the figures, the dimensions of layers and regions may be exaggerated for clarity of illustration. Accordingly, shapes of the exemplary views may be modified according to manufacturing techniques and/or allowable errors. Inventive concepts are not limited to the specific shape illustrated in the exemplary views, but may include other shapes that may be created according to manufacturing processes. For example, an etched region illustrated or described as a rectangle will, typically, have rounded or curved features. Thus, the regions illustrated in the figures are schematic in nature and their shapes are not intended to illustrate the precise shape of a region of a device and are not intended to limit the scope of inventive concepts.

Figure 2:
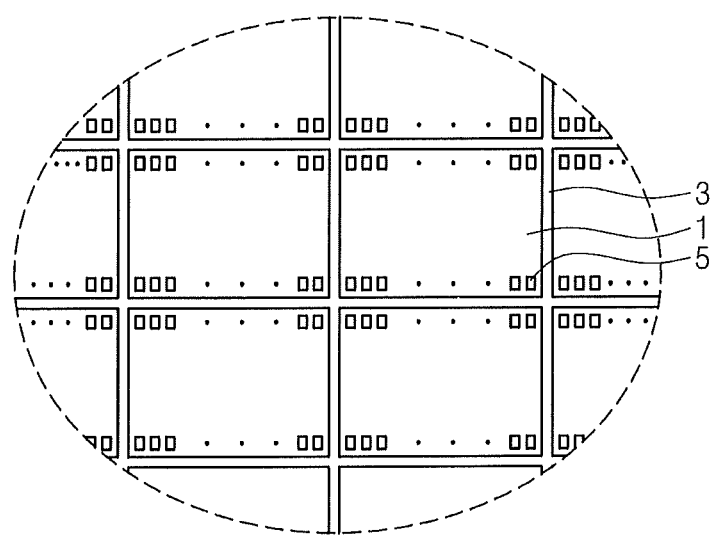
FIG. 2 is an enlarged view of portion A of FIG. 1.

FIG. 1 is a view of a wafer on which semiconductor devices are disposed, and FIG. 2 is an enlarged view of portion A of FIG. 1.

Referring to FIGS. 1 and 2, a plurality of semiconductor devices 1 are disposed on (or, created in) a wafer W through a fabrication (FAB) process. The plurality of semiconductor devices 1 are separated from each other along scribe lanes 3, and then, each of the plurality of semiconductor devices 1 is manufactured as an individual unit chip through an assembly process.

An electric die sorting (EDS) process for testing electrical characteristics of the semiconductor devices 1 disposed on the wafer W is performed between the FAB process and the assembly process. The EDS process is a process in which an electrical signal is applied to electrode terminals 5 disposed, for example, along a periphery of each of the semiconductor devices 1 that is disposed on the wafer W. The EDS process employs the applied electrical signal to determine whether a semiconductor device 1 is defective.

Hereinafter, a semiconductor test apparatus that is used to perform the EDS process will be described.

Figure 3:
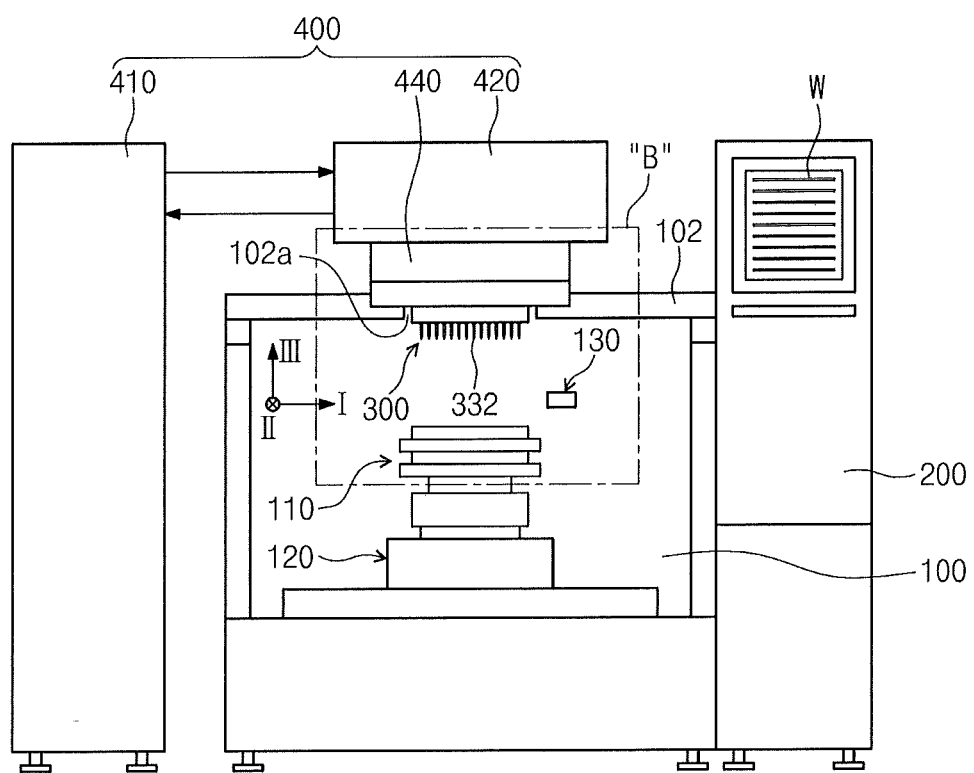
FIG. 3 is a schematic view of a substrate testing apparatus.

FIG. 3 is a schematic view of a substrate testing apparatus.

Referring to FIG. 3, a semiconductor test apparatus 10 includes a probe chamber 100, a load chamber 200, a probe card 300, and a tester 400.

The probe chamber 100 provides a space within which the EDS process for testing electrical characteristics of a semiconductor device is performed. The load chamber 200 is disposed adjacent to one side of the probe chamber 100. The load chamber 200 may accommodate the wafer W to be tested to transmit the wafer W into the probe chamber 100. A chuck 110 is disposed inside the probe chamber 100. The probe card 300 is disposed in a hole 102a defined in an upper wall 102 of the probe chamber 100 to face the chuck 100. The wafer W transmitted from the load chamber 200 is disposed on the chuck 110. The wafer W is disposed on the chuck 110 in a state where a main surface, which may be an active surface, of the wafer W on which an electrode terminal of the semiconductor device is disposed faces upward.

The chuck 110 is disposed on a transfer member 120. The chuck 110 may fix the wafer W using vacuum adsorption, for example. Sand paper (not shown) may be disposed on one surface of the chuck 110. The sand paper (not shown) may have predetermined roughness. When an end of each of tips 332 of the probe card 300 is stained with foreign substances, the end of the probe 332 may be sanded by the sand paper to remove the foreign substances.

The transfer member 120 may linearly move the chuck 110 in horizontal directions I and II and a vertical direction III to rotate the chuck 110 with respect to a self central axis of the chuck 110 that is perpendicular to a plane of the wafer W. The horizontal directions I and II may be a direction in which the semiconductor devices are arranged on the plane of the wafer W, and the vertical direction III may be a direction that is perpendicular to the plane of the wafer W.

When the transfer member 120 rotates the chuck 110, a direction in which the electrode terminals of the semiconductor device disposed on the wafer W are arranged may be aligned in a direction in which the tips 332 of the probe card 300 are arranged. When the transfer member 120 moves the chuck 110 in the horizontal directions I and II, the electrode terminals of the semiconductor device disposed on the wafer W may be aligned directly under the tips 332 of the probe card 300. When the transfer member 120 linearly moves the chuck 110 in the vertical direction, the electrode terminals of the semiconductor device disposed on the wafer W may physically contact the tips 332 of the probe card 300.

The tips 332 and the electrode terminals may physically contact each other to form contact marks on the electrode terminals. A photographing member 130, such as a direct probe sensor (DPS) camera, may be used to confirm the contact marks. The photographing member 130 may be disposed on one side of the chuck 110 to photograph a surface of each of the electrode terminals, thereby acquiring image data. The image data may be transmitted to a control unit (not shown), which may determine whether the contact marks are formed on desired positions, or defective contact marks occur due to contact failure.

The tester 400 includes a tester body 410 and a tester head 420. The tester body 410 is disposed on the other side of the probe chamber 100 from the load chamber. The tester body 410 may output an electrical signal for testing the semiconductor device and receive an electrical signal related to a test result to determine whether the semiconductor device operates normally (that is, passes the test). The tester head 420 is electrically connected to the tester body 410. The tester body 410 includes a base unit 440 to which the probe card 300 is connected, and the tester head 420 transmits the electrical signal between the probe card 300 connected to the base unit 440 and the tester body 410. Connectors (not shown) are disposed on a bottom surface of the base unit 440. The connectors of the base unit 440 and the connectors 312 of the probe card 300 may be provided as a male and female pair of connectors, for example. The probe card 300 may be coupled to the base unit 440 to close an opened lower portion of the base unit 440. The connectors of the probe card 300 may be coupled to the connectors 312 of the base unit 440 (see FIG. 5).

The wafer W may be transmitted from the load chamber 200 to the probe chamber 100 and disposed on the chuck 110. The transfer member 120 rotates and horizontally moves the chuck 110 to align the electrode terminals of the semiconductor device disposed on the wafer W to correspond to the tips 332 of the probe card 300. The transfer member 120 vertically moves the chuck 110 to allow the electrode terminals of the semiconductor device to contact the tips 332 of the probe card 300.

The tester body 410 may output an electrical signal to test the electric characteristics of the semiconductor device. The tester head 420 transmits the outputted electrical signal of the tester body 410 to the probe card 300. The electrical signal transmitted to the probe card 300 may be applied to a semiconductor device through the electrode terminals that are in contact with the tips 332. The semiconductor device responds to the applied electrical signal by performing an operation and outputting an electrical signal indicative of a test result through the electrode terminals. The electrical signal of the test result, or, response signal, outputted from the electrode terminal may be transmitted to the probe card 300 through tips 332 in contact with the electrode terminals. The probe card 300 may transmit the electrical signal of the test result to the tester head 420. The tester body 410 may receive the electrical signal of the test result from the tester head 420 to determine whether the semiconductor device normally operates.

Figure 4:
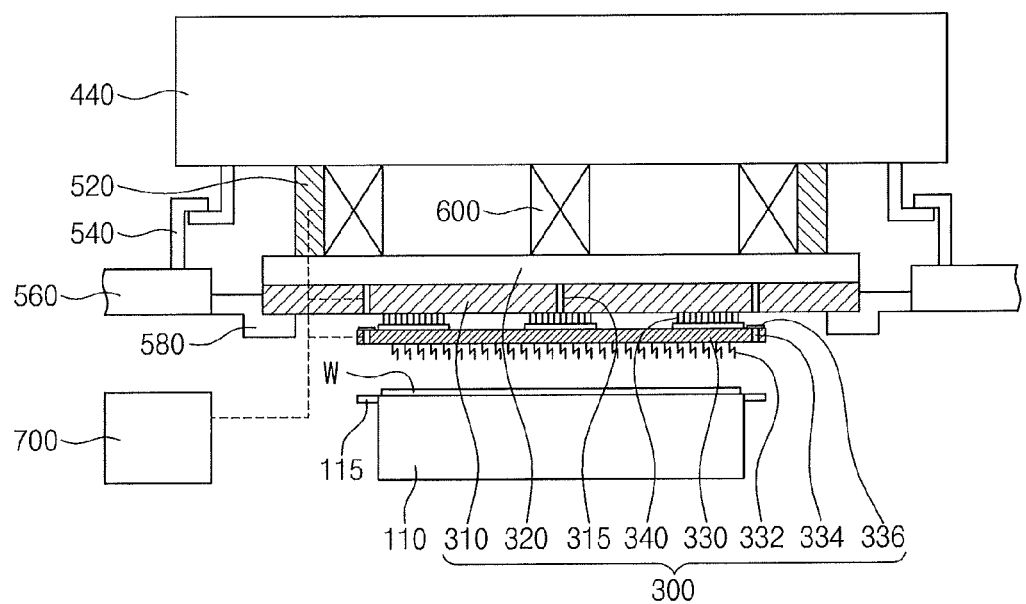
FIG. 4 is an enlarged view of portion B of FIG. 3.

FIG. 4 is an enlarged view of portion B of FIG. 3.

Referring to FIG. 4, the wafer W is disposed on the chuck 110. A second reflection plate 115 may be disposed on the chuck 110. The second reflection plate 115 may be disposed on a side surface of the chuck 110. The second reflection plate 115 may be provided in plurality along a circumference of the chuck 110. The second reflection plate 115 may be vertically parallely-disposed with respect to a second sensor 334 that will be described below. In exemplary embodiments, the second reflection plate 115 may be disposed on an edge of the chuck 110.

The probe card 300 may be disposed on, or over, the chuck 110. The probe card 300 may include a probe substrate 310, a stiffener 320, a lower substrate 330, and an interposer 340. In exemplary embodiments probe substrate 310 may have a disc shape. The probe substrate 310 may be formed of a glass epoxy resin material, for example. In exemplary embodiments in accordance with principles of inventive concepts, first sensor 315 may be disposed in the probe substrate 310. The first sensor 315 may be provided in plurality in a central portion and outer circumferential surface of the probe substrate 310. The first sensor 315 may be a laser beam type measurement device, for example, and may measure a distance between the probe substrate 310 and the lower substrate 330.

In exemplary embodiments stiffener 320 is disposed on the probe substrate 310 and may prevent the probe substrate 310 from being twisted or distorted, for example.

The interposer 340 may connect the lower substrate 330 to the probe substrate 310. The tips 332 that are physically in contact with the electrode terminals of the semiconductor device to be tested may be disposed on a bottom surface of the lower substrate 330.

The lower substrate 330 is disposed on a bottom surface of the probe substrate 310 and may have a rod shape having a length enough to accommodate the whole rows or columns that are defined by the semiconductor devices on the wafer W. The second sensor 334 may be disposed in the lower substrate 330 and may be provided in plurality along an outer circumferential surface of the lower substrate 330. A first reflection plate 336 may be disposed on the lower substrate 330. The first reflection plate 336 may be vertically parallely-disposed with respect to the first sensor 315. The first reflection plate 336 may be provided in plurality in a central portion and along the outer circumferential surface of the lower substrate 330. The first reflection plate 336 may be provided in number to correspond to that of the first sensor 315. In exemplary embodiments, one first reflection plate 336 may be disposed on the central portion of the lower substrate 330, and four first reflection plates 336 may be disposed on the outer circumferential surface of the lower substrate 330, for example.

The tips 332 may be disposed on the bottom surface of the lower substrate 330 and contact the electrode terminals disposed on the semiconductor device on the wafer W. The tips 332 may have a needle shape, having a thin diameter, or thickness. The tips 332 may transmit a test signal transmitted from the tester 400 to the semiconductor device. The tips 332 may be provided in plurality to transmit a signal to a plurality of semiconductor devices at once. In exemplary embodiments, the tips 332 may apply current to each of the semiconductor devices to measure resistance of the semiconductor device.

A cylinder 520 and a press device 600 may be disposed between the base unit 440 and the probe card 300. The cylinder 520, which may be formed of an elastic member, may be provided in plurality between the base unit 440 and a central area of the probe card 300 and between the base unit 440 and an edge area of the probe card 300, for example. In exemplary embodiments, the elastic member of the cylinder 520 may be coil spring or elastic rubber. The cylinder 520 may connect the base unit 440 to the probe card 300. In exemplary embodiments, cylinder 520 may buffer pressure applied to the probe card 300 when the wafer W is tested.

The pressure device 600 may be provided in plurality between the base unit 440 and the central area of the probe card 300 and between the base unit 440 and the edge area of the probe card 300. In an EDS process in accordance with principles of inventive concepts, the wafer W may be tested in a condition in which the temperature of tested devices is varied between a temperature of about −20° C. and about 90° C. in order to ensure reliability of the tested semiconductor devices. As wafers W increase in diameter, probe cards 300 may increase in size to accommodate them. As a result, probe cards 300 could be deformed when the wafer W is tested at temperature extremes. For example, when the wafer W is tested at a low temperature, the probe card 300 may be convexly bent upward and when the wafer W is tested at a high temperature, the probe card 300 may be convexly bent downward. With such bending, or warpage, the contact positions of the tips 332 with respect to the electrode pads 5 of the wafer W may be changed and yield losses in a test process may occur due to process failure. That is, with such warpage, a good chip may be incorrectly determined as a defective chip, thereby reducing yield. In exemplary embodiments in accordance with principles of inventive concepts, pressure device 600 corrects, or prevents, deformation of the probe card 300.

In exemplary embodiments in accordance with principles of inventive concepts, pressure devices 600 may correct warpage or distortion or vertical position of the probe card 300 according to an overdriving amount calculated by the control unit 700. The overdriving amount, also referred to herein as a correction force, is based on a difference between a distance between the probe card 300 and the wafer W or the chuck 110 when the tips 332 contact the wafer W and a distance between the probe card 300 and the wafer W or the chuck 110 after the test is completed. The correction force, or "overdriving amount," may vary over the surface of the probe card 300. The pressure devices 600 may apply a force, a correction force, for pushing or pulling the probe card 300 on a central area of the probe card 300 and adjust horizontality of the probe card 300 on an edge area of the probe card 300. Additionally, the probe card 300 may be changed in vertical position by a pressure applied by tips 332 to the probe card 300. The pressure device 600 may correct the vertical position of the probe card 300 and may be connected to the stiffener 320 disposed on the probe card 300.

In exemplary embodiments support member 540 has one end that is connected to the bottom surface of the base unit 440 and the other end connected to head plate 560. The head plate 560 may be fixed to the probe chamber 100. A fixing member 580 is connected to the head plate 560. The probe card 300 is disposed on the fixing member 580. The fixing member 580 is in contact with a portion of the bottom surface and a side surface of the probe card 300 so that the probe card 300 is fixed. In exemplary embodiments in accordance with principles of inventive concepts, the fixing member 580 may have a ring shape having a hollow inside and a stepped portion, for example. The lower substrate 330 and the tips 332 may be exposed to the hollow defined in the fixing member 580.

The control unit 700 may control the photographing member 130, the first sensor 315, the second sensor 334, and the pressure device 600. The control unit 700 may be connected to the photographing member 130, the first sensor 315, the second sensor 334, the pressure device 600, and the tester 400. In exemplary embodiments in accordance with principles of inventive concepts control unit 700 may determine an overdriving amount through information amount using the photographing member 130, the first sensor 315, and the second sensor 334. The control unit 700 transmits a signal to the pressure device 600 according to the measured overdriving amount to control the pressure device 600. The control unit 700 may receive a signal from the tester 400. The tester 400 applies current to the semiconductor devices disposed on the wafer W and transmits information with respect to the applied current to the control unit 700. The control unit 700 may control the pressure device 600 in response to received information.

Figure 5:
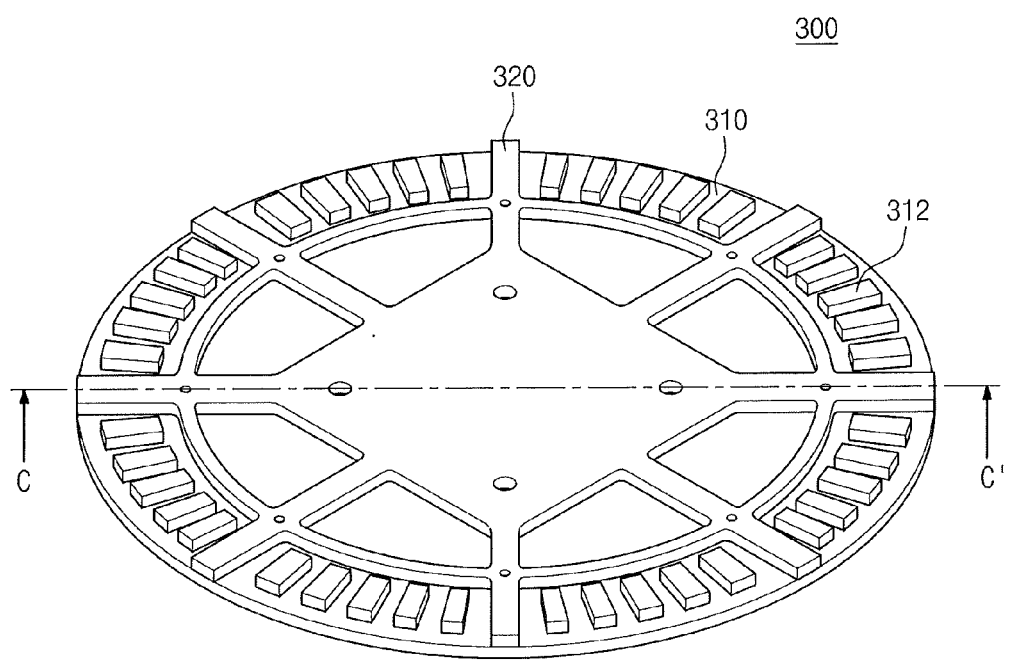
FIG. 5 is a perspective view illustrating a top surface of a probe card of FIG. 3.
Figure 6:
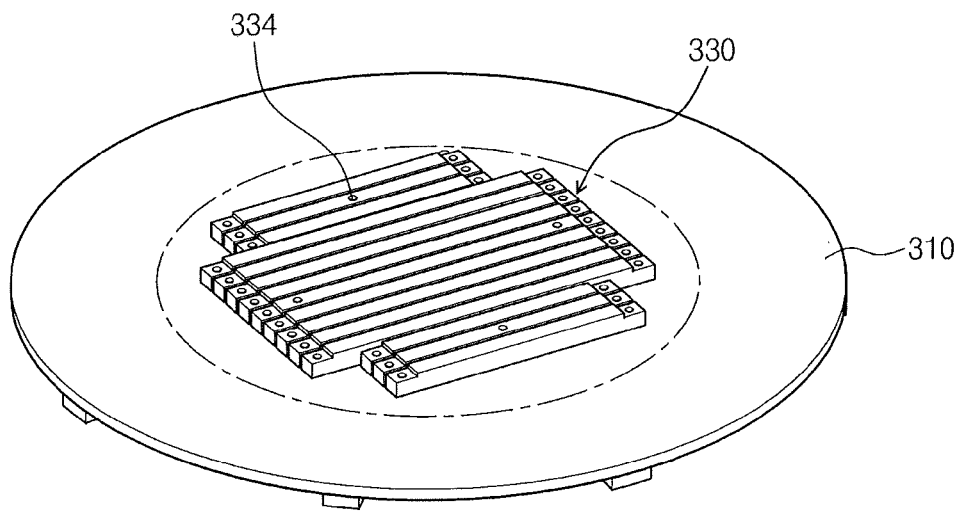
FIG. 6 is a perspective view illustrating a bottom surface of the probe card of FIG. 3.
Figure 7:
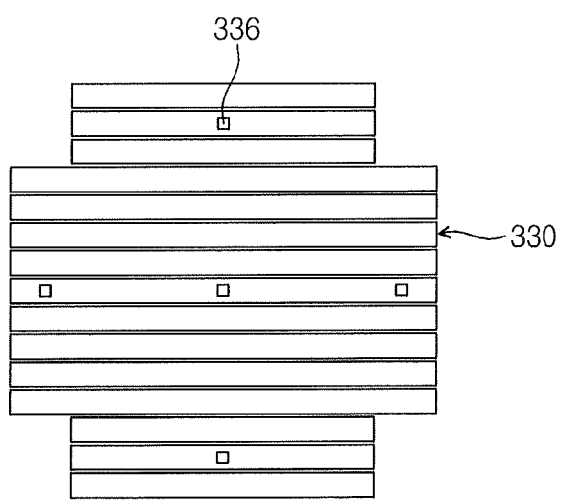
FIG. 7 is a perspective view illustrating a top surface of a lower substrate.
Figure 8:
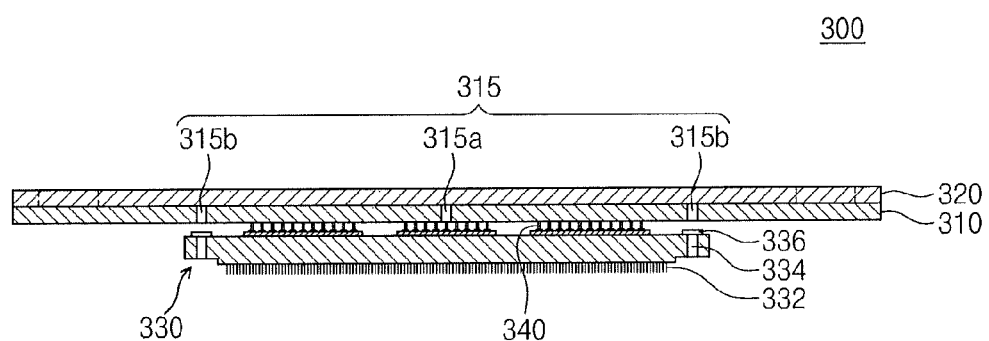
FIG. 8 is a cross-sectional view of the probe card taken along line C-C' of FIG. 5.

FIG. 5 is a perspective view illustrating a top surface of a probe card of FIG. 3, FIG. 6 is a perspective view illustrating a bottom surface of the probe card of FIG. 3, FIG. 7 is a perspective view illustrating a top surface of a lower substrate, and FIG. 8 is a cross-sectional view of the probe card taken along line C-C' of FIG. 5.

Referring to FIGS. 5 to 8, the probe card 300 includes probe substrate 310 having a disc shape. The probe substrate 310 may be formed of a glass epoxy resin material, for example. A wire is disposed on the probe substrate 310. In exemplary embodiments stiffener 320 for preventing deformation such as warpage or distortion of the probe substrate 310 is disposed on a top surface of the probe substrate 310. The connectors 312 may be disposed on an edge of the top surface of the probe substrate 310 along a circumferential direction. The connectors 312 may physically connect the probe card 300 to the tester head 420 to determine position of the probe card 300. Connectors 312 may be zero insert force (ZIF) connectors, for example. The connectors 312 may connect the probe substrate 310 to the tester head 420. In this manner, a test signal generated from the tester 400 may be transmitted to the probe substrate 300.

The first sensor 315 may be disposed in the probe substrate 310 and may be provided in plurality in the central portion and the outer circumferential surface of the probe substrate 310. The first sensor 315 may include a first central sensor 315a and a first outer sensor 315b. For example, one first central sensor 315a may be disposed in the central portion of the probe substrate 310. Four first outer sensors 315b may be disposed on the outer circumferential surface of the probe substrate 310. The first sensor 315 may measure the distance between the probe substrate 310 and the lower substrate 330.

The lower substrate 330 may be disposed on the bottom surface of the probe substrate 310 and may have a rod shape having a length in which entire rows or lines that are formed by the semiconductor devices on the wafer W are accommodated. In exemplary embodiments lower substrate 330 is connected to the probe substrate 310 by the interposer 340. The second sensor 334 may be disposed in the lower substrate 330 and may be provided in plurality along the outer circumferential surface of the lower substrate 330. For example, four second sensors 334 may be disposed on the outer circumferential surface of the lower substrate 330. The first reflection plate 336 may be disposed on the lower substrate 330. The first reflection plate 336 may be parallely-disposed with respect to the first sensor 315 in a vertical direction. The first sensor 336 may be provided in plurality on the central portion and along the outer circumferential surface of the lower substrate 330. The first reflection plate 336 may be provided in number to correspond to that of the first sensor 315. In exemplary embodiments, one first reflection plate 336 may be disposed on the central portion of the lower substrate 330, and four first reflection plates 336 may be disposed on the outer circumferential surface of the lower substrate 330, for example. The tips 332 that are physically in contact with the electrode terminals of the semiconductor device to be tested may be disposed on the bottom surface of the lower substrate 330.

Figure 9A:
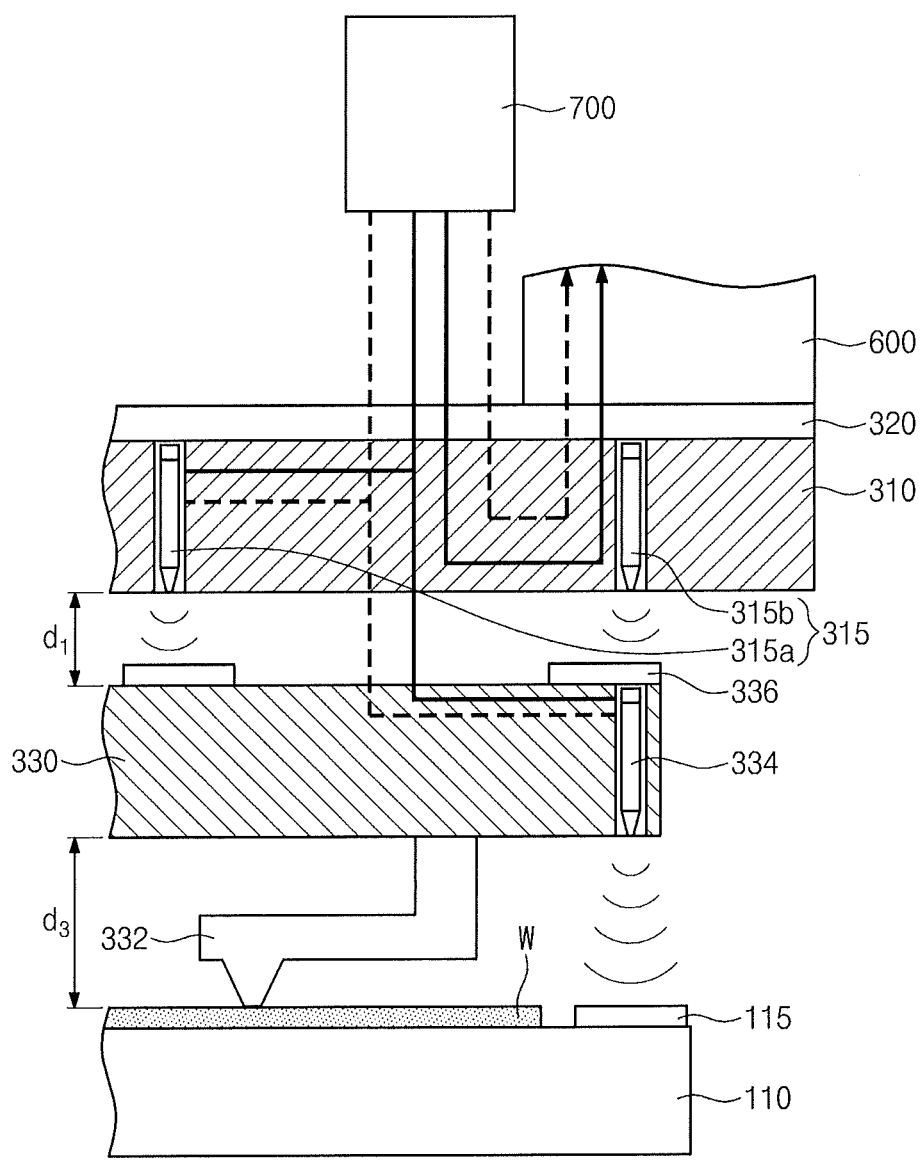
FIGS. 9A and 9B are views illustrating a state in which a sensor measures deformation of the probe card.
Figure 9B:
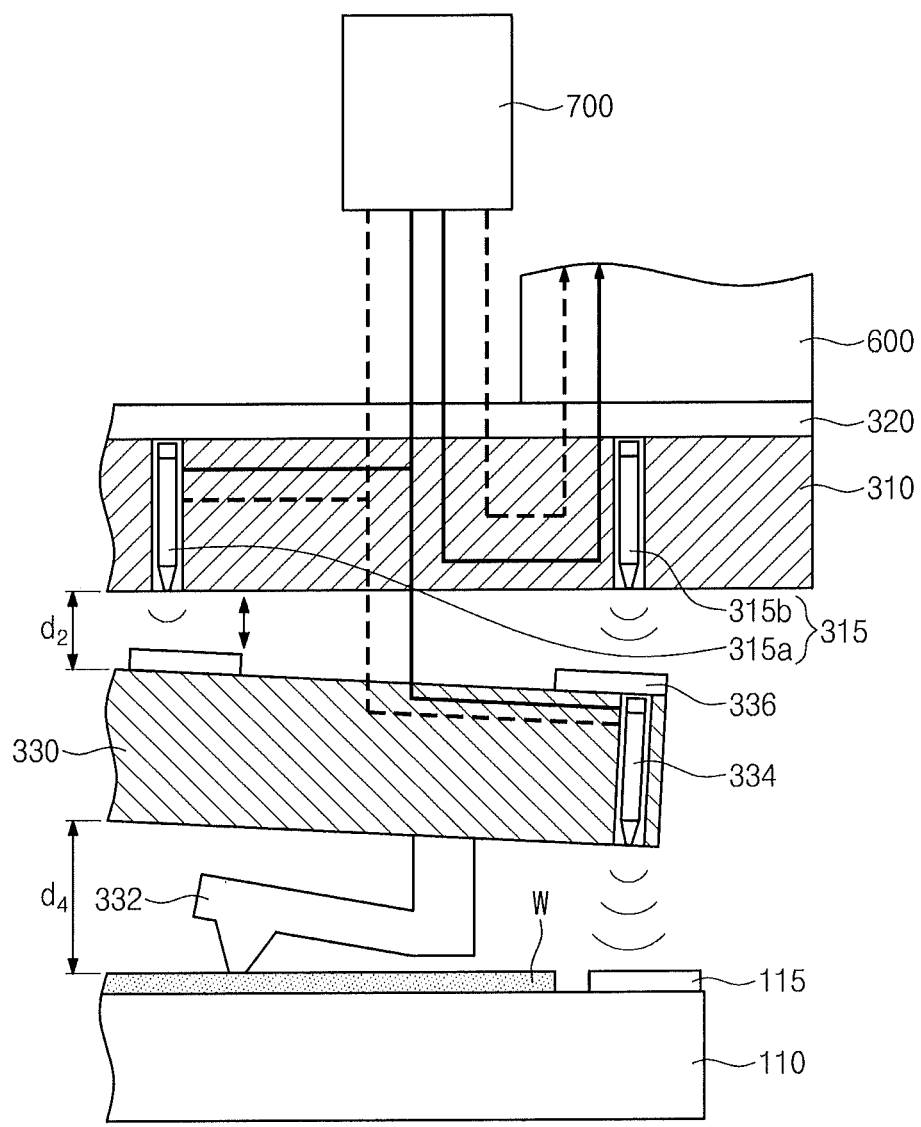
Figure 10:
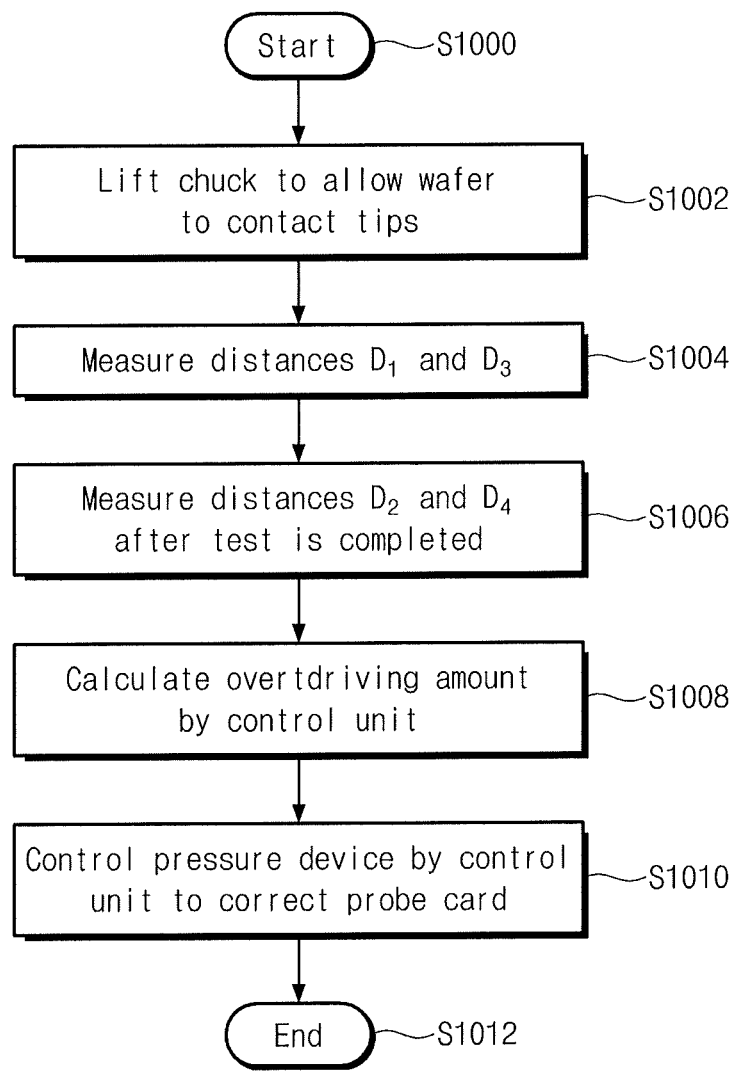
FIG. 10 is a flowchart showing a method in which the sensor measures the deformation of the probe card.

FIGS. 9A and 9B are views illustrating exemplary embodiments of a state in which a sensor measures deformation of the probe card, and FIG. 10 is a flowchart showing a method in which the sensor measures the deformation of the probe card in accordance with principles of inventive concepts.

In exemplary embodiments first sensor 315 may be disposed in the probe substrate 310, and the second sensor 334 may be disposed in the lower substrate 330. The first sensor 315 may include the first central sensor 315a and the first outer sensor 315b. The control unit 700 is connected to the pressure device 600, the first central sensor 315a, the first outer sensor 315b, and the second sensor 334.

In exemplary embodiments in accordance with principles of inventive concepts, a wafer W including a semiconductor device to be tested is disposed on the chuck 110 and transfer member 120 lifts the chuck 110 so that the wafer W on the chuck 110 contacts the tips 332. When the wafer first makes contact with the tips 332, first sensors (central 315a and outer 315b) measure the distances (first distances, d1) between the probe substrate 310 and lower substrate 330 and the second sensor(s) 334 measures the distance (third distances, d3) between the lower substrate 330 and chuck 110, at their respective locations. The distances d1 may be the same for all first sensors and the distances d3 may be the same for all second sensors.

While the test is performed, the tips 332 contact the wafer W and apply a pressure to the probe card 300. Probe card 300 could be warped or otherwise deformed by the pressure. Additionally, the pressure could alter the distance between the probe substrate 310 and the lower substrate 330 or the distance between the lower substrate 330 and the chuck 110. If the tips 332 were warped, the distance between the lower substrate 330 and the chuck 110 could be changed.

After testing devices on wafer W first sensors 315a, 315b again measure the distance (second distance, d2) between the probe substrate 310 and lower substrate 330 at their respective positions and second sensor 334 may again measures the distance (fourth distance, d4) between the lower substrate 330 and chuck 110. The distance(s) d2 may vary among first sensors 315a, 315b and may vary from the initial measurement of distance d1. Similarly, distance d4 may vary among second sensors 334 and from third distance d3.

Differences Z1 (between distances d1 and d2) and Z2 (between distances d3 and d4) may be employed by control unit 700 to apply compensating force(s) to probe card 300 to thereby mitigate movement, such as distortions (for example, warping), as indicated by differences between distances d1 and d2 and/or between distances d3 and d4. In exemplary embodiments in accordance with principles of inventive concepts, pressure device 600 may be employed by control unit 700 apply force, which may vary across the surface of probe card, with greater or lesser force applied at the circumference of probe card than at the center, depending upon whether the card is convexly distorted upwardly or downwardly, for example. The pressure device 600 may maintain the probe card 300 in a horizontal state and vertically move the probe card 300 to adjust a distance between the probe substrate 310 and the lower substrate 330 and a distance between the lower substrate 330 and the chuck 110.

In exemplary embodiments in accordance with principles of inventive concepts, when correction with respect to the warpage, distortion, or position change of the probe card 300 is completed, using differences Z1 and Z2 to determine force values for pressure device 600, a new wafer W to be tested is disposed on the chuck 110. Then, wafer alignment, an EDS process, and contact mark reading may be successively performed. While the test process is performed later, the warpage of the probe card 300 may be corrected, using pressure device 600 under control of control unit 700, as previously described, and the above-described process may be repeatedly performed again with respect to a new wafer W.

An exemplary process in accordance with principles of inventive concepts as just described may be further described in conjunction with the flow chart of FIG. 10 in which the process begins in step S1000 and proceeds to step S1002, where the chuck 110 is lifted to allow a wafer under test W to come into contact with tips 332. The process then proceeds to step S1004 where distances d1 and d3 are measured. The wafer W is then tested and, afterward, distances d2 and d4 are measured in step S1006. After measuring distances d2 and d4 the process proceeds to step S1008, where control unit 700 determines an "overdriving" amount, a measure of pressure to be applied to probe card 300. In step S1010 control unit 700 employs pressure device 600 to correct any distortion, warpage, tipping, or vertical displacement in the probe card, as previously described. From step S1010 the process proceeds to end in step S1012.

Figure 11A:
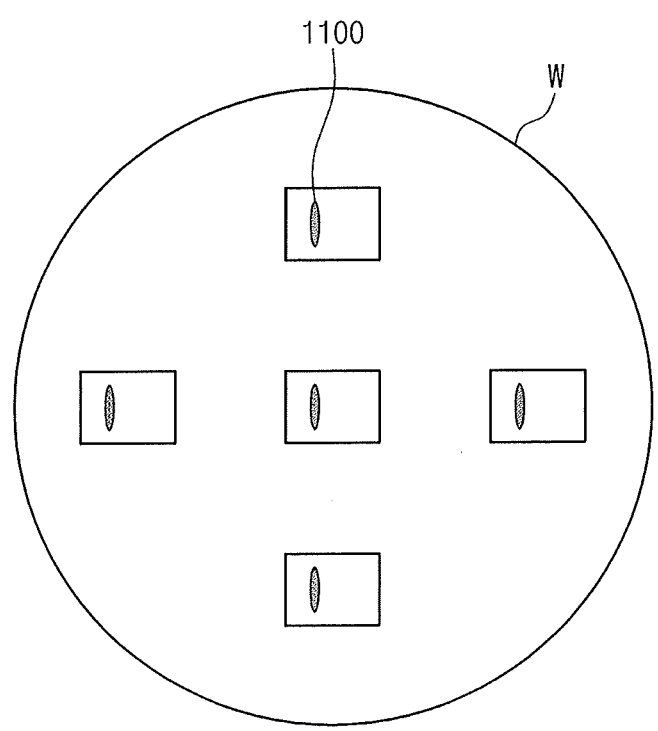
FIGS. 11A and 11B are views illustrating a state in which a photographing member measures deformation of the probe card.
Figure 11B:
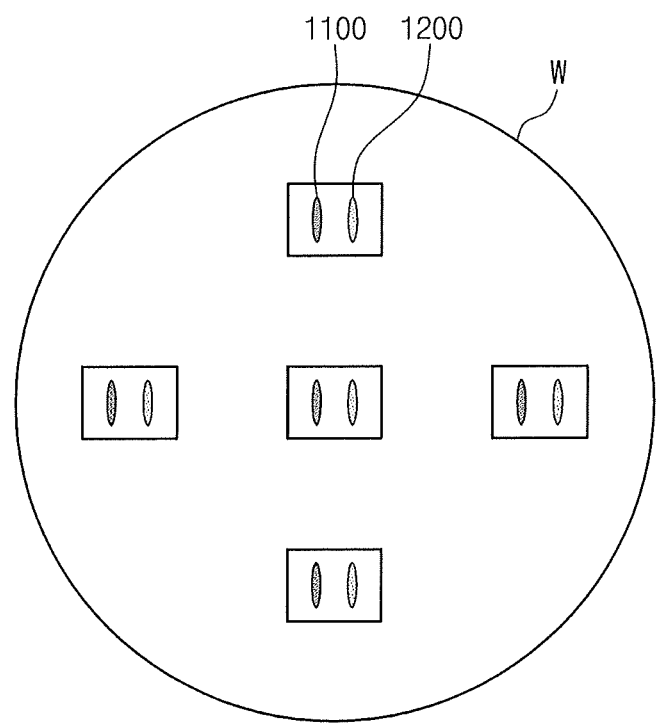
Figure 12:
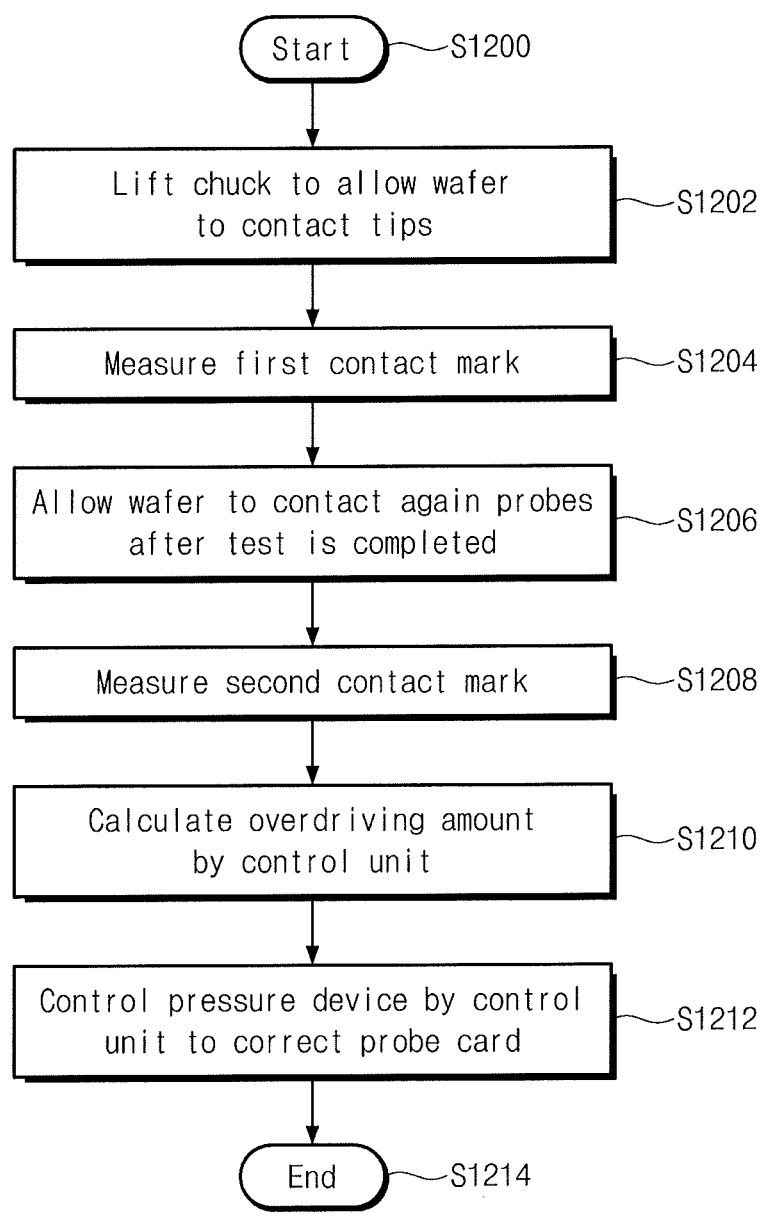
FIG. 12 is a flowchart showing a method in which the photographing member measures the deformation of the probe card.

FIGS. 11A and 11B are views illustrating a state in which a photographing member measures deformation of the probe card, and FIG. 12 is a flowchart showing a method in which the photographing member measures the deformation of the probe card.

In exemplary embodiments in accordance with principles of inventive concepts, photographing member 130 may be a camera for photographing the wafer W on the chuck 110, for example. The wafer W including semiconductor device(s) to be tested is disposed on the chuck 110. The transfer member 120 may lift the chuck 110 so that the wafer W on the chuck 110 contacts the tips 332. Before a test is performed, the photographing member 130 may photograph a first contact mark 1100 formed on the semiconductor device through a first contact. After the test is completed, the tips 332 may again contact the wafer W, and thus the photographing member 130 may photograph a second contact mark 1200 formed on the semiconductor device through a second contact. The control unit 700 may compare the first contact mark 110 to the second contact mark 1200 to determine an overdriving amount (which may be an amount of force to be applied by pressure device 600, or by which force to be applied is adjusted, for example). In accordance with principles of inventive concepts, a degree of deformation of probe card 300 may be determined by comparing the clarity of first contact mark 1100 to the second contact mark 1200.

For example, if the first contact mark 110 is clearer than the second contact mark 1200, this represents that a distance between the probe card 300 and the wafer W increases. If the second contact mark 1200 is clearer that the first contact mark 1100, this represents that a distance between the probe card 300 and the wafer W decreases. The control unit 700 may transmit a signal to the pressure device 600 according to the measured overdriving amount to control the pressure device 600. In exemplary embodiments in accordance with principles of inventive concepts, the pressure device 600 may apply forces different from each other onto the central portion and the outer circumferential surface of the probe card 300. The pressure device 600 may maintain the probe card 300 in a horizontal state and at the same time vertically move the probe card 300 to adjust a distance between the probe card 300 and the wafer W.

In another exemplary embodiment, the photographing member 130 may determine whether the contact mark is formed on a desired position. The photographing member 130 may photograph a position of the contact mark to determine whether the wafer W is aligned with the probe card 300.

An exemplary embodiment in accordance with principles of inventive concepts, such using contact marks will be described in conjunction with the flow chart of FIG. 12. The process begins in step S1200 and proceeds from there to step S1202 where chuck 110 is lifted to allow the wafer to be tested W to come in contact with tips 332. From step S1202 the process proceeds to step S1204 where a first contact mark is measured. From step S1204 the process proceeds to step S1206 after testing wafer W and probes contact wafer W again. From step S1206 the process proceeds to step S1208 where second contact mark(s) are measured. In step S1210 differences between first and second contact marks are used to determine an "overdriving amount," which is used by control unit 700 to apply pressure to probe card 300 in step S1212. From step S1212 the process proceeds to end in step S1214.

As described above, when the correction with respect to the warpage, distortion, or position change of the probe card 300 is completed, a new wafer W to be tested is disposed on the chuck 110. Then, wafer alignment, an EDS process, and contact mark reading may be successively performed. Then, while the test process is performed later, the warpage of the probe card 300 may be corrected, and the above-described process may be repeatedly performed again with respect to a new wafer W.

Figure 13:
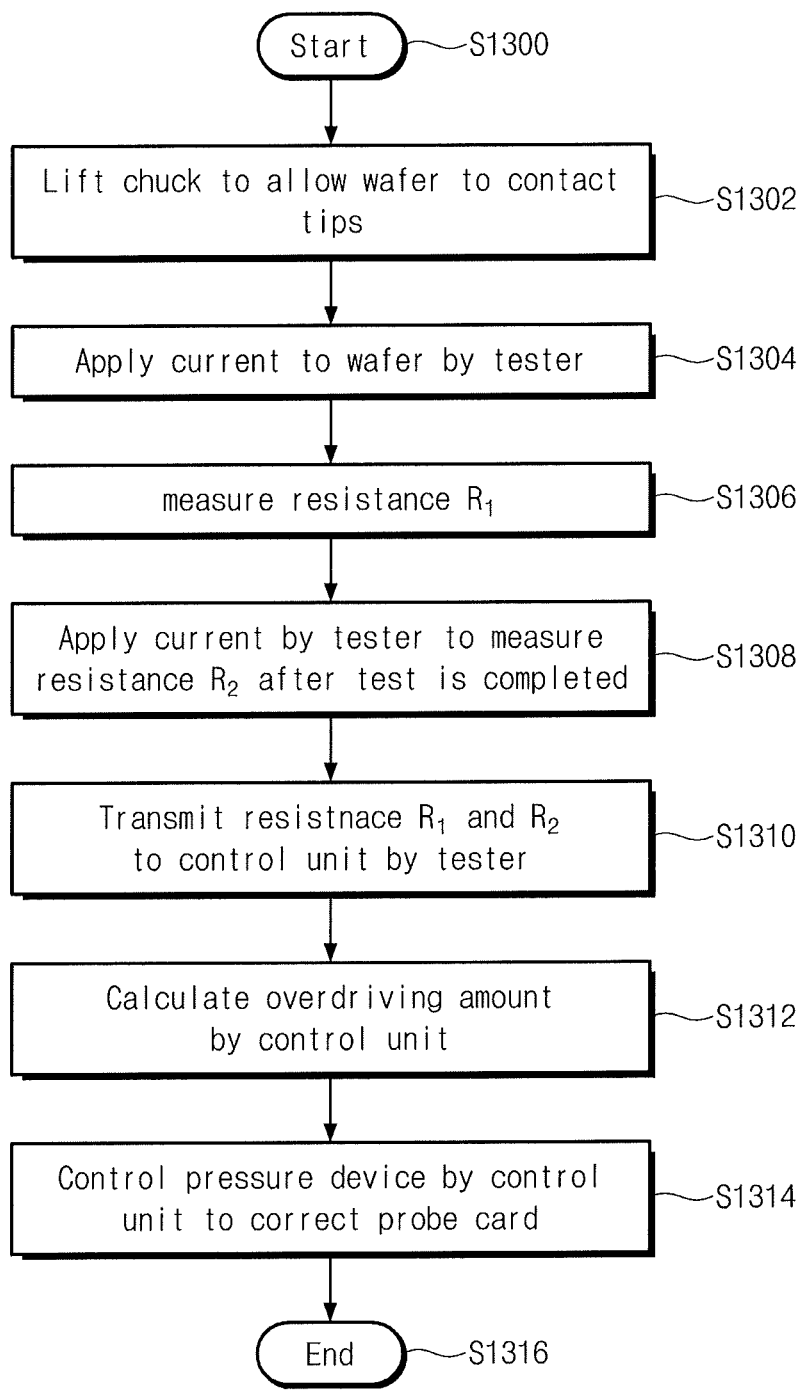
FIG. 13 is a flowchart showing a method in which the deformation of the probe card is measured through resistance of the semiconductor device.

FIG. 13 is a flowchart showing a method in which the deformation of the probe card is measured through resistance of a semiconductor device.

The tester 400 may apply current to measure characteristics of the semiconductor device. The tester 400 may measure resistance of the semiconductor device by using the current applied to the semiconductor device.

The wafer W including the semiconductor device is disposed on the chuck 110 in step S1300. The transfer member 120 may lift the chuck 110 in step S1302 so that the wafer W on the chuck 110 contacts the tips 332. The tester 400 may apply current to the wafer W through the tester head 420 in step S1304. The tester 400 may measure resistance $R_1$ of each of the semiconductor devices at a moment in which the tips 332 contact the wafer W in step S1306. After the test is completed, the tester 400 applies current to the wafer W to measure resistance $R_2$ of each of the semiconductor devices in step S1308. The tester 400 may transmit the measured resistance $R_1$ and resistance $R_2$ to the control unit 700 in step S1310. The control unit 700 may calculate an overdriving amount (that is, a force, or additional force, to be applied to probe card 300) using the resistance $R_1$ and the resistance $R_2$ in step S1312. For example, when the distance between the tips 332 and the wafer W is greater than a reference distance, the tips 332 may not normally contact the wafer W. In this case, the resistance $R_2$ may be greater than that $R_1$. When the distance between the tips 332 and the wafer W is less than a reference distance, the resistance $R_2$ may be less than that $R_1$. In exemplary embodiments control unit 700 transmits a signal to the pressure device 600 according to the measured overdriving amount to control the pressure device 600 in step S1314. In exemplary embodiments, the pressure device 600 may apply forces different from each other onto the central portion and the outer circumferential surface of the probe card 300. In exemplary embodiments in accordance with principles of inventive concepts pressure device 600 may maintain the probe card 300 in a horizontal state and at the same time vertically move the probe card 300 to adjust a distance between the probe card 300 and the wafer W. After controlling the pressure device 600 in step S1314, the process may end in step S1316.

In exemplary embodiments in accordance with principles of inventive concepts, before the test is performed, resistance $R_0$ of the semiconductor device may be determined. After a test is completed, the tester 400 applies the current to the wafer W to measure resistance $R_2$ of the semiconductor device. The tester 400 may transmit the measured resistance $R_0$ and resistance $R_2$ to the control unit 700 and control unit 700 may calculate an overdriving amount by using the resistance $R_0$ and the resistance $R_2$.

As described above, when the correction with respect to the warpage, distortion, or position change of the probe card 300 is completed, a new wafer W to be tested is disposed on the chuck 110. Then, wafer alignment, an EDS process, and contact mark reading may be successively performed. Then, while the test process is performed later, the warpage of the probe card 300 may be corrected, and the above-described process may be repeatedly performed again with respect to a new wafer W.

In exemplary embodiments in accordance with principles of inventive concepts, deformed probe card may be corrected in vertical position while being corrected in horizontal warpage by application of pressure, which may vary from point to point on the probe card, to the probe card according to measurements indicative of distortion or displacement.

According to the embodiment of the inventive concept, an overdriving amount, which may be an amount related to a reference amount of force or pressure, may be determined using a sensor, a photographing member, or a resistance, for example, and a deformed probe card may be corrected through the pressure device.

The above-disclosed subject matter is to be considered illustrative and not restrictive, and the appended claims are intended to cover all modifications, enhancements, and other embodiments that fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. An apparatus for testing a semiconductor device, the apparatus comprising:
    a chuck on which a wafer is disposed;
    a probe card disposed on the chuck to provide a test signal to the wafer;
    a sensor in the probe card to measure a relative distance between portions of the probe card;
    a base unit connected to the probe card to transmit the test signal to the probe card; and
    a pressure device connecting the base unit to the probe card, the pressure device correcting deformation of the probe card, wherein the probe card comprises a probe substrate and a lower substrate disposed under the probe substrate; and
    wherein the sensor comprises:
    a first sensor disposed in the probe substrate; and
    a second sensor disposed in the lower substrate.

2. The apparatus of claim 1, wherein the pressure device are provided in plurality on a central portion of the probe card and along a circumference of the probe card.

3. The apparatus of claim 1, wherein the probe card further comprises:
    a stiffener disposed on the probe substrate; and
    tips connected to the lower substrate.

4. The apparatus of claim 1,
    wherein the first sensor is provided in plurality in a central portion of the probe substrate and along an outer circumferential surface of the probe substrate, and
    the second sensor is provided in plurality along an outer circumferential surface of the lower substrate.

5. The apparatus of claim 4, wherein the first sensor is configured to measure a distance between the probe substrate and the lower substrate, and
    the second sensor is configured to measure a distance between the lower substrate and the chuck.

6. The apparatus of claim 4, further comprising a control unit for controlling the first sensor, the second sensor, and the pressure device,
    wherein the first sensor is configured to measure a first distance that is a distance between the probe substrate and the lower substrate at a moment in which tips connected to the lower substrate of the probe card contact the wafer and a second distance that is a distance between the probe substrate and the lower substrate at a moment in which the test is completed,
    the second sensor is configured to measure a third distance that is a distance between the lower substrate and the chuck at a moment in which the tips contact the wafer and a fourth distance that is a distance between the lower substrate and the chuck at a moment in which the test is completed, and
    the control unit is configured to calculate a correction force based on a difference between the first distance and the second distance and a difference between the third distance and the fourth distance.

7. The apparatus of claim 1, further comprising a probe chamber surrounding the chuck,
    wherein a movable photographing member is provided on an inner wall of the probe chamber to photograph the wafer on the chuck.

8. The apparatus of claim 7, further comprising a control unit for controlling the photographing member and the pressure device,
    wherein the photographing member is configured to photograph a first image that is an image of the wafer after tips connected to the lower substrate of the probe card first contact the wafer and a second image that is an image of the wafer after the tips next contact the wafer, and
    the control unit compares the first image to the second image to calculate a correction force.

9. The apparatus of claim 1, further comprising a tester connected to the base unit,
wherein the tester comprises:
a tester head disposed on the base unit; and
a tester body electrically connected to the tester head, wherein the tester body, the tester head, the base unit, and the probe card are electrically connected to each other.

10. The apparatus of claim 9, further comprising a control unit connected to the tester to control the pressure device,
wherein the tester is configured to apply current to a semiconductor device on the wafer at a moment in which tips connected to the lower substrate of the probe card contact the wafer to measure a first resistance of the semiconductor device,
the tester applies current to the semiconductor device on the wafer after the test is completed to measure a second resistance of the semiconductor device, and
the control unit receives the first resistance and second resistance measured by the tester to calculate a correction force.

11. A method of testing a semiconductor device, the method comprising:
providing a semiconductor wafer including the device on a chuck;
allowing tips disposed on a bottom surface of a probe card to contact the wafer;
determining a correction force according to deformation of the probe card; and
applying a pressure to the probe card using a plurality of pressure devices disposed on a central portion of the probe card and along an outer circumferential surface of the probe card according to the correction force to correct warpage of the probe card.

12. The method of claim 11, wherein the probe card comprises:
a probe substrate;
a stiffener disposed on the probe substrate;
a lower substrate disposed under the probe substrate; and
tips connected to the lower substrate,
wherein a sensor is provided in the probe card,
wherein the sensor comprises:
a first sensor disposed on the probe substrate; and
a second sensor disposed on the lower substrate,
wherein the first sensor is provided in plurality on a central portion of the probe substrate and along an outer circumferential surface of the probe substrate, and
the second sensor is provided in plurality along an outer circumferential surface of the lower substrate.

13. The method of claim 12, wherein the determination of a correction force comprises:
measuring a first distance that is a distance between the probe substrate and the lower substrate at a moment in which the tips contact the wafer and a second distance that is a distance between the probe substrate and the lower substrate at a moment in which the test is completed, by the first sensor;
measuring a third distance that is a distance between the lower substrate and the chuck at a moment in which the tips contact the wafer and a fourth distance that is a distance between the lower substrate and the chuck at a moment in which the test is completed, by the second sensor; and
determining a correction force based on a difference between the first distance and the second distance and a difference between the third distance and the fourth distance.

14. The method of claim 11, wherein the determination of a correction force comprises:
allowing the tips to firstly contact the wafer to photograph a first contact mark with respect to the wafer;
allowing the tips to secondly- contact the wafer after a test is completed to photograph a second contact mark with respect to the wafer; and
comparing the first contact mark to the second contact mark to determine a correction force based on a difference between clear degrees of the contact marks formed on the wafer.

15. The method of claim 11, wherein the determination of a correction force comprises:
allowing the tips to contact the wafer to apply current, thereby measuring a first resistance of a semiconductor device on the wafer;
allowing the tips to contact the wafer after a test is completed to apply the current, thereby measuring a second resistance of the semiconductor device on the wafer; and
determining a correction force based on a difference between the first resistance and the second resistance.

16. A method of testing a semiconductor device, the method comprising:
providing a semiconductor wafer on a chuck;
applying a test signal to the semiconductor wafer including the semiconductor device by a probe card;
determining distortion of the probe card by a sensor in the probe card during a test process; and
providing a correction force to the probe card to counteract the distortion of the probe card,
wherein the probe card comprises a probe substrate and a lower substrate disposed under the probe substrate; and
wherein the determination of distortion of the probe card comprises:
measuring a first distance that is a distance between the probe substrate and the lower substrate and a second distance that is a distance between the chuck and the lower substrate.

17. The method of claim 16, wherein the correction force varies across the probe card.

18. The method of claim 17, wherein the method includes testing the semiconductor wafer at various temperatures.

19. The method of claim 18, wherein the distortion of the probe card is determined by measuring distances of the probe card from reference points before and after conducting the test process.

20. The method of claim 19, wherein the correction force is applied to the probe card during the test process subsequent to the test process during which distortion of the probe card is measured.

* * * * *